United States Patent [19]

Barrow

[11] Patent Number: 4,862,073
[45] Date of Patent: Aug. 29, 1989

[54] REPETITIVE WAVE SAMPLER

[75] Inventor: Jeffrey G. Barrow, Oak Ridge, N.C.

[73] Assignee: Analog Devices, Inc., Norwood, Mass.

[21] Appl. No.: 256,645

[22] Filed: Oct. 12, 1988

[51] Int. Cl.$^4$ ............................................. G01R 23/02
[52] U.S. Cl. .................... 324/78 R; 307/352; 328/151; 324/77 A
[58] Field of Search ............... 324/78 R, 78 D, 78 E, 324/78 F, 78 N, 78 Q, 78 S, 79 R, 79 D, 77 A, 77 R, 121 R; 307/352, 572; 328/151

[56] References Cited

U.S. PATENT DOCUMENTS 4,030,840  6/1977  Lawton et al. ................. 324/121 R
4,647,795  3/1987  Agoston .............................. 307/352

OTHER PUBLICATIONS

Burr-Brown, Corp., *The Handbook of Linear IC Applications*, A Waveform Digitizer for Dynamic Testing of High-Speed Data Conversion Components (1987), pp. 98-106.

Primary Examiner—Michael J. Tokar
Attorney, Agent, or Firm—Wolf, Greenfield & Sacks

[57] ABSTRACT

A repetitive wave sample suited to monolithic integrated circuit fabrication, comprising a comparator followed by a master/slave latch feeding into an integrator. The inputs of the comparator are connected to (a) an unknown repetitive waveform having a known frequency and (b) the output of the integrator, which is provided to the comparator through a feedback loop. The master/slave latch is controlled by a clock pulse having a frequency equal to the frequency of the unknown waveform. The master latch is activated on the falling edge of the clock pulse. The integration performed on the output of the slave latch causes the output voltage of the integrator (i.e., the output of the circuit) to approach the point being sampled on the unknown input waveform. The output voltage will eventually settle to within a preset error range of the input point being sampled.

9 Claims, 1 Drawing Sheet

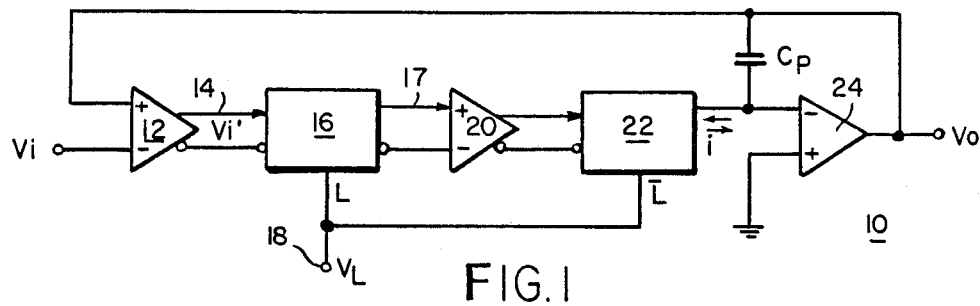
FIG. 1
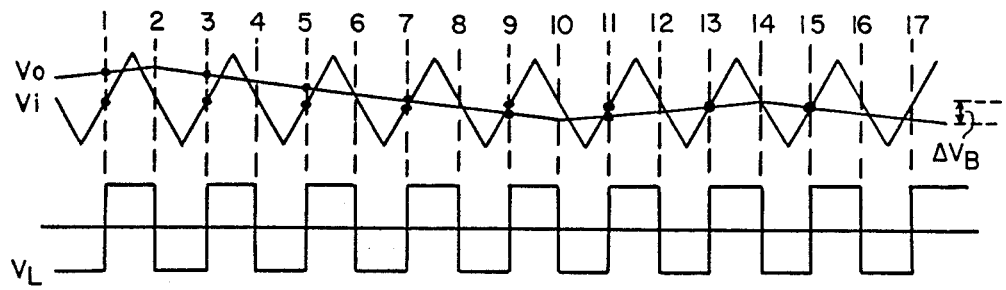
FIG. 2
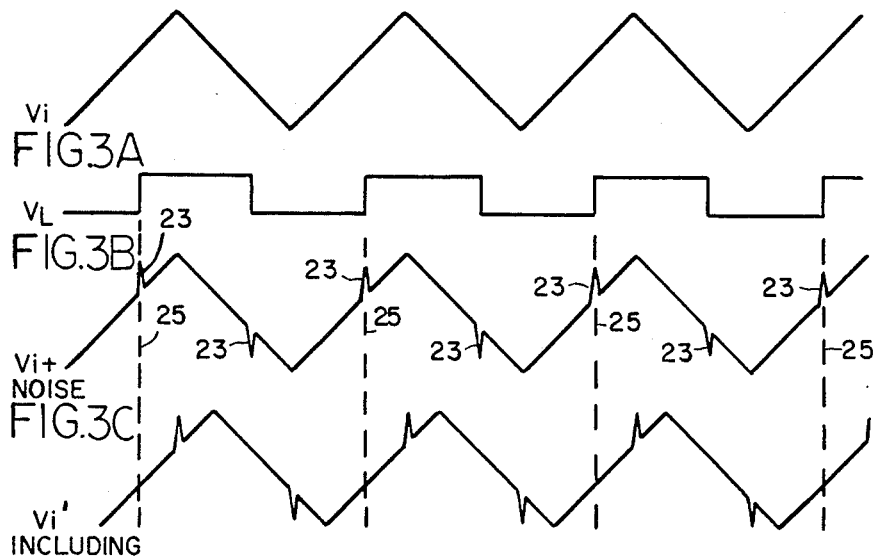
FIG. 3A
FIG. 3B
FIG. 3C
FIG. 3D

REPETITIVE WAVE SAMPLER

FIELD OF THE INVENTION

The invention relates to a repetitive wave sampler. More particularly, the invention relates to a high speed, high resolution integrating repetitive wave sampler.

BACKGROUND OF THE INVENTION

A repetitive wave sampler in used to obtain instantaneous values on an unknown waveform having a known frequency of repetition and/or to reconstruct the unknown waveform. It operates on principles which take advantage of the fact that the signal being sampled has a known frequency of repetition.

A repetitive wave sampler can be used in conjunction with an analog to digital converter to sample and reconstruct an unknown waveform having a known frequency. Repetitive wave samplers can be used in many application. Such typical applications include laboratory and production testing of both analog and digital devices. During laboratory or production testing of a device, a known waveform is provided at the input of the device under test (D.U.T.) and it is desired to determine the output waveform. Many of the performance specifications of a device, such as output rise and fall times, overshoot etc., are determined in this manner. The known input waveform can be fed in at a known repetition rate such that the output of the device will be an unknown waveform but with a known repetition rate.

One method typical of the prior art of sampling repetitive waveforms is utilized in sampling oscilloscopes. Typically, a sampling oscilloscope operates on the principle of a stroboscope. A repetitive waveform of known frequency is sampled at a rate slightly slower than the rate of repetition of the waveform. In this manner each consecutive sample is taken at a point which progresses incrementally along the cycle of the waveform. The ratio between the sampling rate and the rate of repetition of the waveform will determine the number of samples obtained during one cycle of the repetitive waveform. The locus of points obtained in this manner, over the course of several cycles, can be displayed to reconstruct a replica of the unknown repetitive signal.

The accuracy of such circuits/samplers, however, leaves much to be desired. Any noise in the signal during sampling will distort the measurement at that point. Discrete circuit implementations of repetitive wave samplers are particularly prone to noise since external electrical couplings produce substantial noise in the circuit and discrete circuits require substantially longer conductor lengths (wires) than integrated circuit implementations. Decreasing the length of the conductors in the circuit is particularly helpful in reducing the inherent inductance of the wires which can seriously diminish the accuracy of the device.

Moreover, the samplers typically have a significant amount of input capacitance. This input capacitance, coupled with the inherent inductance from the wires, may cause the circuit to exhibit resonances which may significantly reduce the accuracy of the measurement. The probe input capacitance is particularly bothersome in sampling high frequency signals because it can easily load the circuit by providing a parasitic, low impedance path to ground. For these reasons, integrated circuit implementations of wave samplers, particularly high frequency wave samplers, is highly desirable.

Further, the prior art means for sampling waveforms are limited in terms of the maximum bandwidth of the signal which can be sampled. As the bandwidth of the signal to be sampled increases, the size, power consumption and cost of the apparatus necessary to perform the sampling function increases dramatically. Typically, circuits capable of sampling a waveform having a bandwidth of 100 MHz or higher consume several watts of power, require a large number of connection pins (12-24 or more pins) and are limited in both the input range and the resolution available.

Therefore, it is an object of the present invention to provide an improved repetitive wave sampler.

It is another object of the present invention to provide a repetitive wave sampler having high resolution.

It is a further object of the present invention to provide a repetitive wave sampler capable of sampling waveforms having a bandwidth of 350 MHz and greater.

It is yet another object of the present invention to provide a high speed repetitive wave sampler having low power consumption.

It is further object of the present invention to provide a high speed wave sampler of small size.

It is another object of the present invention to provide a high speed repetitive wave sampler having low input capacitance.

It is one more object of the present invention to provide a high speed repetitive wave sampler having a large input range.

It is still another object of the present invention to provide a high speed repetitive wave sampler having low input inductance.

It is yet another object of the present invention to provide a high speed repetitive wave sampler having inherent immunity to uncorrelated noise.

It is one more object of the present invention to provide a high speed repetitive wave sampler having low sensitivity to inductively and capacitively coupled noise.

SUMMARY OF THE INVENTION

The invention comprises a repetitive wave sampler which can determine, within a preset error range, a sequence of sample values along a repetitive waveform having a known frequency but unknown shape. The sequence of sample values obtained thereby can be used to reconstruct the unknown waveform.

The invention comprises five circuit stages. Stage one is a comparator which receives the signal to be sampled, $V_i$, as a first input and the stage five output, through a feedback loop, as a second input. The output of the comparator is fed into stage two, which is a master latch which latches on to the comparator output at the rising edge of a clock pulse, $V_L$, having frequency equal to the frequency of $V_i$. The output of the master latch is fed into a delay circuit forming stage three and therefrom into a slave latch, which is stage four. The slave latch is activated by the falling edge of the same clock pulse that controls the master latch. The output of the slave latch is fed into an inverting input of an integrator, which is stage five. The output of the integrator, $V_o$, which is the output of the repetitive wave sampler, also is fed back to one input of the stage one comparator, as noted above.

In operation, the output of the comparator is a positive voltage if $V_o$ is greater than $V_i$ and a negative voltage if $V_i$ is greater than $V_o$. At the rising edge of the clock pulse, the master latch samples the output of the comparator and supplies a positive current at its output if the comparator output is positive, (i.e. $V_i$ $V_o$) or a negative current if the comparator output is negative (i.e. $V_i$ $V_o$). The delayed output of the master latch, from stage 3, is then clocked into the slave latch at the falling edge of the clock pulse. The stage three delay circuit is needed to hold the data until it is latched by the slave latch, because the master latch becomes transparent when unlatched and could therefore pass erroneous information. The output of the slave latch, is, in turn, supplied to the inverting input of the integrator. If the output of the integrator (which is fed back into the comparator) was higher than the input voltage when the master latch sampled the comparator output, then the output of the comparator would be a positive voltage. Likewise, if the output of the integrator was lower than the input voltage, the output of the comparator would be a negative voltage. As stated, the latches supply positive current in response to a positive comparator output and negative current in response to a negative comparator output. Therefore, if $V_o$ is greater than $V_i$, the integration of the positive output of the slave latch will cause $V_o$ to slope downwardly over time thereby causing $V_o$ to approach $V_i$. Alternately, if $V_o$ was lower than $V_i$, the integration of the low output of the slave latch causes $V_o$ to slope upwardly over time, thereby still causing $V_o$ to approach $V_i$. After a reasonable number of clock cycles, $V_o$ will continue to "bounce" around $V_i$ ad infinitum, remaining within a preset range, $\Delta V_e$, of $V_i$. The acceptable output voltage error, $\Delta V_e$, can be set by choosing an appropriate value for the integrator capacitor (and/or the current that is integrated, i.e., the output of the slave latch).

In this manner, one point on the repetitive wave can be sampled. By changing the phase of the clock pulse in relation to the input signal, other points on the repetitive waveform can also be sampled. This process may be repeated for any number of points along the phase spectrum of the input waveform (360°) to reconstruct the entire waveform.

The invention will be more fully understood from the detailed description below, which should be read in conjunction with the accompanying drawing. This description is presented by way of example only, the invention being defined only by the claims appended to the end of the description.

BRIEF DESCRIPTION OF THE DRAWING

In the Drawing,

FIG. 1 shows a block diagram of the present invention;

FIG. 2 shows a graphical representation of the output of the circuit of the present invention in relation to a sample input signal and synchronized clock pulse;

FIG. 3A shows a sample input waveform to the repetitive wave sampler of the present invention;

FIG. 3B shows a clock pulse synchronized to the waveform of FIG. 3A;

FIG. 3C shows the input waveform of FIG. 3A with noise spikes in the waveform; and FIG. 3D shows the output of the comparator stage of the present invention in response to the noisy input signal of FIG. 3C.

DETAILED DESCRIPTION

FIG. 1 shows a block diagram of the present invention. The to-be-sampled repetitive waveform of known frequency, labelled $V_i$, is fed into the inverting input of a comparator 12. The non-inverting input of the comparator is connected, through a feedback loop, to the output of the repetitive wave sampler. The output 14 of the comparator is supplied to a master latch 16. The master latch 16 is controlled by a clock pulse, $V_L$, applied on line 19. The clock pulse $V_L$ has the same frequency as the sampled waveform, $V_i$, and is supplied by circuitry which is not shown and is not part of the invention. For testing a device, the test signal generator may also generate the clock. For sampling a waveform of unknown frequency, a phase-locked loop may be synchronized to the waveform $V_i$ to provide a clock signal. The reason for using a synchronized clock will become apparent shortly. The output of the master latch is supplied to the input of a slave latch 22 through a delay circuit 20. The delay circuit 20 is included so as to hold the data on the output 17 of the master latch 18 until it is clocked into the slave latch. This is necessary because the master latch 16 is a transparent latch—i.e., it becomes transparent when unlatched at the falling edge of the clock pulse and could therefore pass inaccurate information. The slave latch is controlled by the same clock 18 which controls the master latch, except that the slave latch is activated by the falling edge rather than the rising edge of the clock pulse. The output of the slave latch is fed into the inverting input of an integrator which consists of an operational amplifier 24 having its non-inverting input coupled to ground and its inverting input coupled to its output through a capacitor C. The output of the operational amplifier is fed back to the non inverting input of the stage one comparator 12, as stated above. The output of the operational amplifier 24 is also the output of the repetitive wave sampler and may be fed into an analog-to-digital converter or other circuitry.

The operation of the circuit will now be described in relation to FIG. 2. The frequency of the repetitive wave $V_i$ must be known and the repetition rate of the clock pulse must be set to that frequency. In this manner, it is assured that the rising edge of the clock pulse, i.e. the point at which the master latch 16 latches on to $V_i$, always occurs at the same point on each cycle of the repetitive input waveform. At time T1 when the clock pulse is at its rising edge, $V_o$ is at some voltage determined by previous activity in the circuit, and $V_i$ is at some point on the input waveform. In the example shown in FIG. 2, at time T1, $V_o$ is greater than $V_i$. Therefore, the output of the comparator 12 is a positive voltage which causes the master latch to supply a positive current. At time T2, the falling edge of the clock pulse occurs and the slave latch 22 latches on to the positive current of the master latch and correspondingly provides a positive current output. In response to the positive current which is fed into input node 11 of the integrator from the slave latch 22, the voltage across capacitor C starts to drop over time. The slope of the falling voltage across capacitor C is determined by the capacitance thereof and the current at the input of the integrator. Therefore, the slope can be controlled by selection of an appropriate capacitor and/or by scaling the current i which is to be integrated by selecting appropriate gain factors in the preceeding circuitry. At time T3, the rising edge of the clock pulse once again causes the master latch to latch on to the output of the comparator. As shown in FIG. 2, $V_o$ is still greater than $V_i$. Therefore, at time T4 when the output of the slave latch is latched to the new output of the master latch, the slave latch output remains positive and the voltage across capacitor C continues to drop.

The output voltage which, due to the virtual ground at node 25, is also the voltage across capacitor C, will continue to drop at the same rate, until $V_o$ drops below $V_i$. In FIG. 2, this occurs at time T9. At time T9, $V_o$ is less than $V_i$ and the comparator output, therefore, flips to a negative voltage. In response thereto, the master latch switches to a negative output. At time T10, the negative output of the master latch is clocked into the slave latch. The low output of the slave latch into the inverting input of the integrator causes the voltage across capacitor C to rise. As shown in FIG. 2, at time T10, the slope of $V_o$ changes from a negative slope to a positive slope. The positive slope of $V_o$ is of the same magnitude as the negative slope. This is true because slave latch 22 supplies currents of equal magnitude in both directions (i.e., polarities) and therefore the rate of voltage change in capacitor C also is the same in both directions. At time T11, the master latch one again latches onto the output of the comparator, which will still be negative because $V_o$ remains lower than $V_i$ at time T11. The output of the master latch at time T11 will remain negative, thereby causing the output of the slave latch at time T12 to remain negative. Therefore, the voltage across capacitor C will continue to rise until time T14. At time T13, $V_o$ is once again greater than $V_i$, and the master latch output current turns positive at that time. In response to the master latch, the slave latch output current becomes positive at time T14. The voltage across the capacitor, which is the output voltage of the repetitive wave sampler will once again start to decrease. As shown in FIG. 2, the slope of $V_{out}$ once again changes polarity and begins to decrease.

$V_o$ will eventually settle to a point where it remains within an error range, $\Delta V_e$, of $V_i$ by bouncing from just below $V_i$ to just above $V_i$ and back again, ad infinitum. The value of $\Delta V_e$ depends on how quickly $V_o$ can change over time, i.e. the slope of $V_o$ as set by capacitor C. The relationship of the capacitance C to $\Delta V_e$ is given by the equation $$C = \frac{i}{\frac{\Delta V_e}{\Delta t}}$$

where
i is given by design,
$\Delta V_e$ is the desired output error, and
$\Delta t$ is 1/(clock frequency).

Selection of a proper capacitance value for capacitor C and the integrated current i is crucial. The capacitor C and current i will determine the slope of $V_{out}$ as it approaches $V_i$. The slope of $V_o$ determines both the length of time it will take $V_o$ to approach $V_i$ and the accuracy, $\Delta V_e$, to within which $V_o$ approximates $V_i$. As the slope of $V_o$ increases, the time required for $V_o$ to approach $V_i$ for any given sample will decrease but $\Delta V_e$ will increase. Therefore, the capacitor C must be chosen to provide a balance between speed and accuracy.

It should be noted that, since the positive and negative slopes of $V_o$ are equal, it is assured that $V_o$ will remain within $\Delta V_e$ of $V_i$ for all time after the point when $V_o$ switches from being higher than $V_i$ to lower than $V_i$ or vice versa. In FIG. 2, this is time T9. For example, in FIG. 2, $V_o$ is just below $V_i$ at time T9 yet $V_o$ continues to slope downwardly for another half cycle. At time T10, $V_o$ begins to slope upwardly at the same rate that it was sloping downwardly from time T9 to time T10. Therefore, at time T11, the relationship of $V_o$ to $V_i$ will be exactly as it was at time T9, since $V_o$ is symmetric about time T10. At time T11, $V_o$ will continue to rise at the same rate and at time T13 will be in exactly the same relation to $V_i$ as it was at time T7, i.e. slightly above $V_i$. As can be seen in FIG. 2, $V_o$ is symmetric about time T10 from time T6 to time T14. $V_o$ will continue to be a symmetric, repetitive waveform ad infinitum. For instance, over the next eight time slots, i.e. four clock cycles, time T14 to time T22, $V_{out}$ will repeat the waveform shown from time T6 to time T14. Therefore, in the example of FIG. 2, at any point after time T9 (when $V_o$ is detected to have crossed over $V_i$), the output of the circuit, $V_o$, will be a correct representation of $V_i$ within an error range of $\Delta V_e$ and an accurate output reading can be taken from the repetitive wave sampler.

The unknown waveform can be reconstructed with this method by obtaining a locus, or sequence, of points in one cycle of the repetitive waveform. A locus of points is obtained by following the above described procedure repeatedly, while incrementally changing the phase relationship between the input signal, $V_i$, and the clock pulse, $V_L$, each time. Any number of points on the cycle can be obtained by altering the phase relationship in appropriately sized steps. For instance, if 500 points per cycle are desired, then the phase relationship between $V_i$ and $V_L$ should be changed by:

$$\frac{360° \text{ per cycle}}{500 \text{ points}} = 0.72° \text{ shift per point}$$

The locus of points obtained thereby can then be used to reconstruct the unknown waveform $V_i$.

The repetitive wave sampler circuit of the present invention provides several advantages over prior art methods. First, the effect of uncorrelated noise (i.e. noise which does not occur at regular intervals) on the accuracy of the output of the device is virtually eliminated because, instead of simply reading a point on the wave as was done in the prior art, the output of the present invention is obtained through an integrator which virtually eliminates the effect of the uncorrelated noise in the signal. Essentially, the integration operation inherently averages out the broad band noise.

In addition, the simplicity of the repetitive wave sampler of the present invention allows it to be monolithically constructed on a single integrated circuit "chip". As noted earlier, integrated circuit construction of repetitive wave samplers is extremely desirable since it minimizes external coupling and substantially reduces conductor length in the circuit. These factors tend to both substantially decrease both the noise in the circuit as well as the undesirable conductor inductance. Further, an integrated circuit implementation typically requires substantially less power consumption than a similar device constructed of discrete elements.

The structure of the present invention provides another noise reduction feature not heretofore known in the prior art. Referring to FIG. 1, the comparator 18, like any electronic component, exhibits a propagation delay between its input $V_i$ and its output $V_i'$. In the present invention, this delay is quite advantageous. Referring now to FIG. 3, the input waveform, $V_i$, and the clock pulse, $V_L$, are shown in FIGS. 3A and 3B. $V_i$ is a triangular waveform having a repetition rate equal to that of the clock pulse. When the latches 16 and 22 switch, noise spikes, as shown at points 23 in FIG. 3C are injected from the latch to the input signal, $V_i$, due to parasitic capacitance and inductive pickup. Due to the delay in the comparator 18, the noise spike in $V_i$ only affects the comparator output, $V_i'$, after the propagation delay of the comparator. Therefore, by the time the noise spike reaches the comparator output, $V_i'$, the master latch 16 has already latched on to the data. This can be seen clearly by reference to FIGS. 3C and 3D. As shown in FIG. 3C, a noise spike is created each time one of the latches switches states $V_i'$, however, due to the propagation delay of the comparator 18, is phase delayed from $V_i$ (see FIG. 3D). Therefore, the noise spike reaches $V_i'$ after the data is latched at points 25. In this manner, the problem of latch noise is eliminated in the present invention.

The simple structure of the repetitive wave sampler of the present invention can achieve sampling rates in excess of 350 MHz yet is readily implemented in circuits consuming only approximately 250 milliwatts. Additionally, input capacitances of less than one picofarad can be achieved, facilitating sampling at such high rates. The simple structure of the present invention is also advantageous in that the repetitive wave sampler can be provided in very small size chips with few interconnections, such as 8 pin dual in line packages, and also in that resolutions in excess of 12 bits can be achieved.

Having thus described one particular embodiment, various alterations, modifications and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is intended to be exemplary only, and not limiting. The invention is limited only as defined in the following claims and equivalents thereto.

What is claimed is:

1. A method of determining the instantaneous value of an unknown repetitive waveform having a known repetition rate, each cycle comprising 360°, comprising the steps of:
   a. comparing a first series of instantaneous values on the repetitive waveform with a second series of instantaneous values on a test signal, the first series comprising instantaneous values separated by 360° so that each instantaneous value in the series is of equal value, said equal value being termed the test value, and the second series comprising instantaneous values concurrent with the instantaneous values in the first series;
   b. producing, for each comparison, a reference signal, the reference signal being in a first state if the unknown waveform is lower than the test signal and in a second state if the unknown waveform is higher than the test signal the first and second states being of equal magnitude and opposite polarity; and
   c. integrating the reference signal after each comparison to produce the test signal, the test signal also being a measurement of the test value after a specified number of comparisons.

2. A method a set forth in claim 1 further comprising the step of:
   supplying as the test value, the test signal at a point in time after the reference signal has changed state.

3. A method as set forth in claim 1 further comprising the steps of:
   d. phase shifting the first and second series of instantaneous values by a phase other than a multiple of 360°; and
   e. repeating steps a, b, c and d so as to obtain the value of a second and subsequent test values on the repetitive waveform whereby the locus of test values obtained thereby represents the unknown waveform.

4. A repetitive wave sampler for measuring an instantaneous value of a repetitive waveform having a known repetition rate, comprising:
   means for producing a comparison voltage representing the instantaneous difference between the repetitive waveform and a test signal at selected instants in time, the instants in time occuring at a frequency equal to the frequency of the repetitive waveform such that each comparison to the test signal is of the same instantaneous value on the cycle of the repetitive waveform, termed the test value;
   means for producing a reference current in response to each comparison, the reference current being in a positive state if the repetitive waveform is less than the test signal and in a negative state if the repetitive waveform is greater than the test signal;
   means for integrating the reference current to produce the test signal, the value of the output waveform after each comparison thereby approaching the test value.

5. A repetitive wave sampler as set forth in claim 4 wherein the output signal is provided as a measurement of the test value.

6. A repetitive wave sampler as set forth in claim 4 wherein the test signal is supplied as the output of the repetitive wave sampler at a point in time after the reference voltage changes polarity.

7. A repetitive wave sampler for measuring an instantaneous value of a repetitive waveform having a known repetition rate, comprising:
   a comparator having a first input coupled to receive the repetitive waveform, a second input coupled to receive a test signal, and an output for supplying a function of the difference between the two inputs;
   means, having an output coupled to the master latch and the slave latch, for providing a series of clock pulses comprising a rising edge and a falling edge, the clock pulses being of frequency equal to that of the repetitive waveform;
   a master latch having an input coupled to receive the output of the comparator and an output which supplies a first, positive current if the repetitive waveform has a higher voltage than the output signal at the rising edge of the clock pulse and a second, negative current if the repetitive waveform has a lower voltage than the output signal at the rising edge of the clock pulse;
   a delay circuit having an input coupled to the output of the master latch for supplying the voltage appearing at its input to its output some time later;
   a slave latch having an input coupled to the output of the delay circuit and an output that, at the falling edge of the clock pulse, provides a current of equal polarity as appeared at the output of the master latch at the immediately preceding rising edge of the clock pulse; and an integrator having an input coupled to the output of the slave latch and an output, the signal at the output being the test signal as well as the output of the repetitive wave sampler;

8. A repetitive wave sampler as set forth in claim 7 further comprising means for reading the output of the sampler after a predetermind number of clock pulses.

9. A repetitive wave sampler as set forth in claim 7 further comprising means for reading the output of the repetitive wave sampler at a time after the reference voltage changes state.

* * * * *